(12) United States Patent
Lee et al.

(10) Patent No.: US 8,609,325 B2
(45) Date of Patent: Dec. 17, 2013

(54) METHOD OF LITHOGRAPHY

(75) Inventors: Fong-Cheng Lee, Hsinchu (TW);
Ching-Yu Chang, Yuansun Village (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 134 days.

(21) Appl. No.: 12/915,270

(22) Filed: Oct. 29, 2010

(65) Prior Publication Data

US 2012/0107747 A1    May 3, 2012

(51) Int. Cl.
*G03F 7/26*    (2006.01)
(52) U.S. Cl.
USPC ........................................... 430/322

(58) Field of Classification Search
USPC .............................. 430/322, 20, 330
See application file for complete search history.

(56) References Cited

U.S. PATENT DOCUMENTS

| | | | |
|---|---|---|---|
| 6,404,472 B1* | 6/2002 | Andreatta et al. | 349/123 |
| 2010/0233817 A1* | 9/2010 | Nakatsugawa | 436/85 |
| 2010/0321607 A1* | 12/2010 | Utsumi et al. | 349/61 |

* cited by examiner

*Primary Examiner* — Kathleen Duda
(74) *Attorney, Agent, or Firm* — Lowe, Hauptman & Ham, LLP

(57) ABSTRACT

A lithography method of manufacturing integrated circuits is disclosed. A photoalignment layer is formed on a substrate. A treatment is performed to reorganize and align the photoalignment molecules. A photoresist layer may be formed on the photoalignment layer in a bi-layer separate coating or with the photoalignment layer in a bound-bind structure.

20 Claims, 14 Drawing Sheets

METHOD OF LITHOGRAPHY

TECHNICAL FIELD

The present disclosure relates to integrated circuit devices and methods for manufacturing integrated circuit devices.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component that can be created using a fabrication process) has decreased. This miniaturization of microelectronic devices continues to match or exceed the predictions of the International Technology Roadmap for Semiconductors. The minimum feature size is now approaching the critical edge of a typical polymer as used in conventional photoresist, and the line width roughness requirement for 32 nm node and beyond is already smaller than the polymer size. Although existing approaches have been generally adequate for their intended purposes, they have not been entirely satisfactory in all respects.

In the prior art lithography processes, a conventional photoresist polymer is used. When this polymer is formed on the substrate, the molecules form in a random pattern and lack uniformity throughout the layer. After the photoresist is exposed and developed, there is a large line edge roughness (LER) that exists as a result of the random pattern of the photoresist molecules. This large LER causes the developed image to blur and reduces the resolution of the lithography and the subsequent etching process. This prevents the formation of the fine pattern required for the continued development of 32 nm and smaller devices.

BRIEF DESCRIPTION OF THE DRAWINGS

The present disclosure is best understood from the following detailed description when read with the accompanying drawings. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
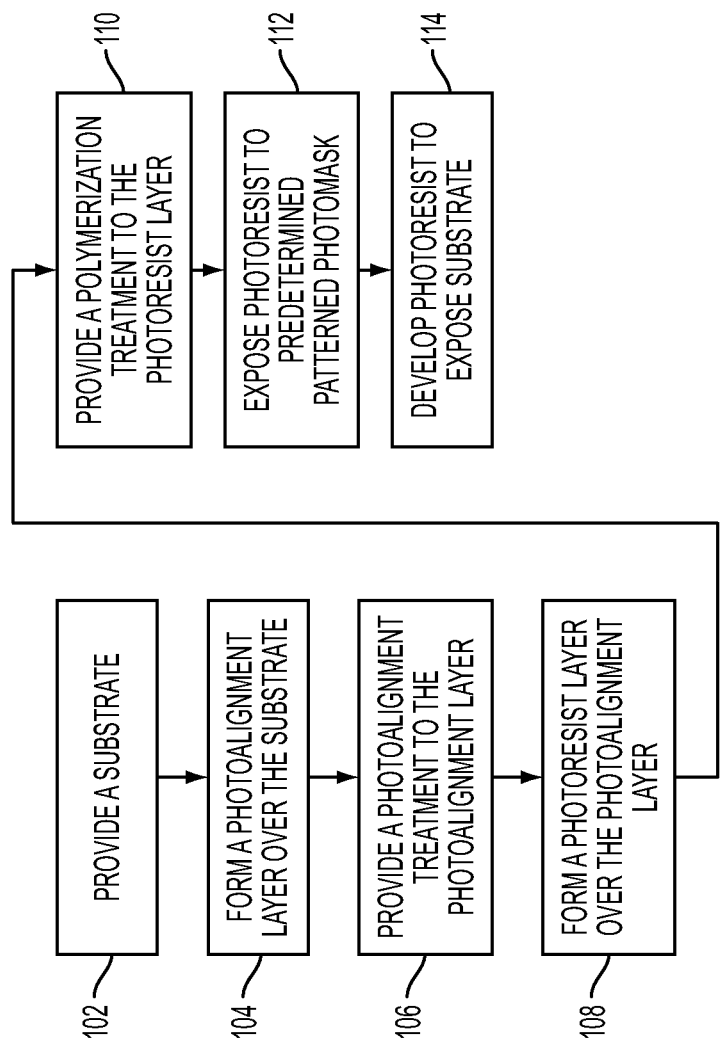
FIG. 1 is a flow chart of a method of fabricating an integrated circuit device according to an embodiment of the present disclosure.

FIG. 1 is a flow chart of a method of fabricating an integrated circuit device according to an embodiment of the present disclosure. FIGS. 2-8 are various diagrammatic cross-sectional views of an embodiment of an integrated circuit device during various fabrication states according to the method of FIG. 1.

Figure 2:
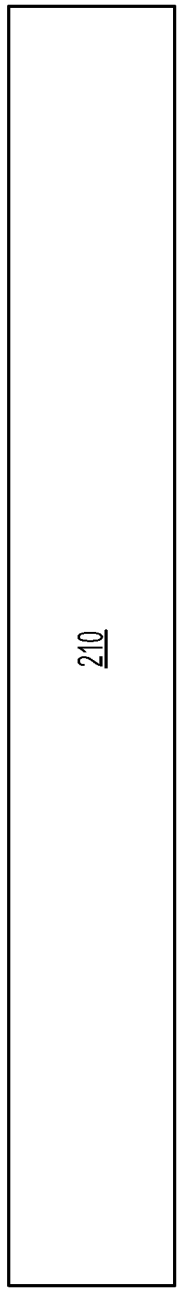
FIGS. 2-8 are various diagrammatic cross-sectional views of an embodiment of an integrated circuit device during various fabrication states according to the method of FIG. 1.

In FIG. 2, a substrate 210 is provided (operation 102). In the depicted embodiment, the substrate is a dielectric with a dielectric constant from about 1 to about 40. In the depicted embodiment, the substrate is comprised of at least silicon, metal oxide, or metal nitride. For example, a formula may be $MX_n$, where M is a metal or Si, and X is Nitrogen or Oxygen with n ranging from about 0.4 to about 2.5. For example, in some embodiments, $SiO_2$, silicon nitride, aluminum oxide, hafnium oxide, or lanthanum oxide may be used.

Figure 3:
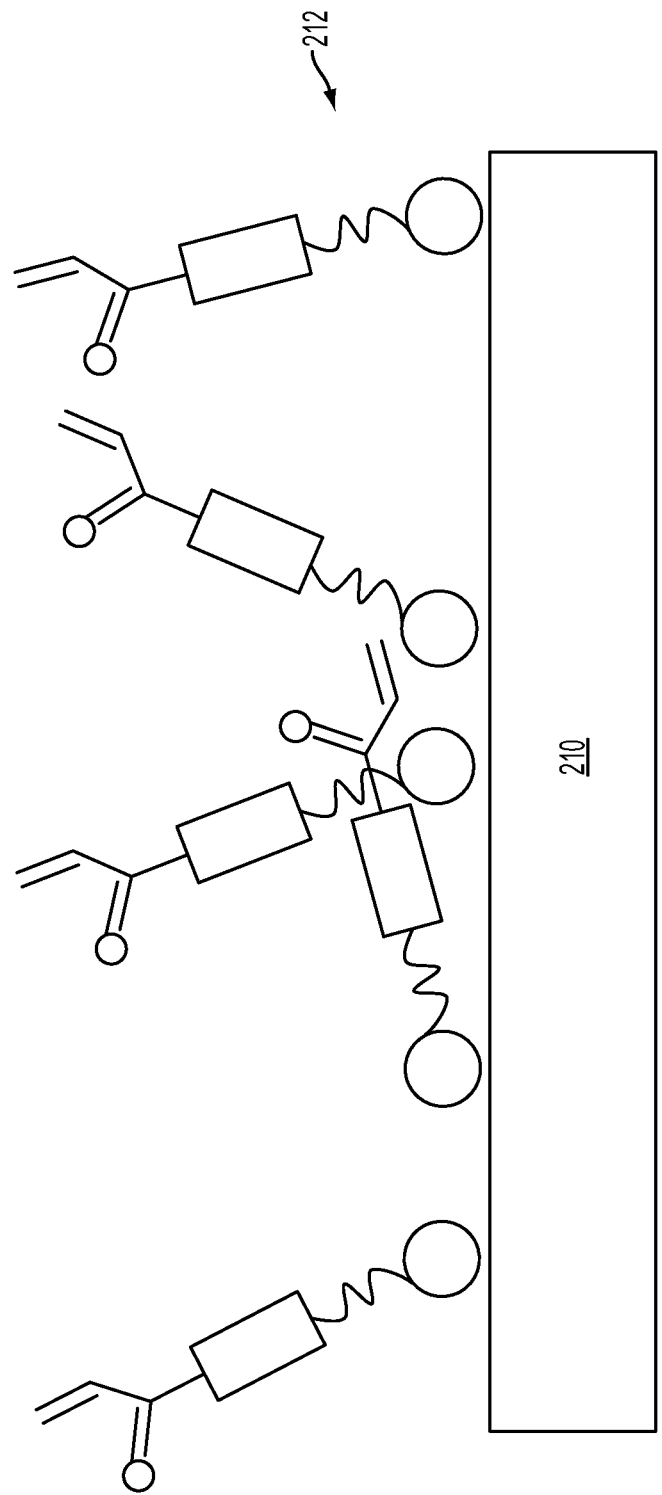

In FIG. 3, a photoalignment layer 212 is then formed over the substrate 210 (operation 104). In the depicted embodiment, the photoalignment layer and subsequent photoresist layers form a bi-layer separate coating. In the depicted embodiment, the photoalignment layer 212 formed by a spin coating process or another suitable process. The photoalignment layer 212 may be composed of a photoalignment polymer. In some embodiments, the photoalignment polymer may be an organic material. For example, the organic material may comprise at least a photoreactive compound, a non-photoreactive compound, reactive or non-reactive additives, and/or a solvent. In the depicted embodiment, the photoalignment layer is a liquid crystal organic polymer comprising photoreactive groups, a relatively unique class of partially crystalline aromatic polyesters based on p-hydroxybenzoic acid and related monomers. Liquid crystal polymers are capable of forming regions of highly ordered structure while in the liquid phase. In some embodiments, the photoalignment layer has a thickness range between 1 nm to 50 nm.

In some embodiments, the photoreactive compound may be composed of a polymer. In some embodiments, the compound comprises poly-acrylate, poly-methacrylate, poly-imide, poly-amic acid, poly-amide, poly-ethylene, poly-ethyleneoxide, poly-propylene, poly-thylene terephthalate, poly-styrene, poly-carbonate, poly-ester, poly-urethan, poly-silicon, poly-acetals, poly-sulfones, other suitable material, or a combination thereof. The photoreactive compound may be sensitive to visible light, UV, 1-line, KrF, ArF, EUV and E Beam light sources.

In some embodiments, the reactive additives may include polymerizable reaction additives. The polymerizable reactive additives may carry at least one polymerizable group: cross linker, for example to activators; chain transfer inhibitor; inhibitors; liquid crystal; accelerators; surface active agents; viscosity modifiers; sensitizers; stabilizers; adhesive agents; flow improvers; auxiliaries; dyes; and/or pigments.

In some embodiments, the non-reactive additives may include: antioxidants; dyes; pigments; inhibitors; accelerators; anti-static agents; stabilizing additives, such as a curing inhibitor, for example hydroquinone; stabilizer, such as a phenol derivative, for example 2,6-di-tert-butyl-4-methylphenol (BHT); dispersing agents; adhesive agents, flow improvers; and/or initiators, especially thermal or photo initiator.

In some embodiments, the photoalignment polymer may be a solid or diluted in a solvent to form a solution, gel, dispersion, or emulsion. The solvent may be organic, water, or a combination thereof. The organic solvent may be composed of a non-polar solvent, polar aprotic solvent, and polar protic solvents. Non-polar solvents are compounds that have low dielectric constants and are not miscible with water, for example hexane, benzene or chloroforms. Polar aprotic solvents are solvents that share ion dissolving power with protic solvents but lack acidic hydrogen, such as for example, tetrahydrofuran (THF), acetonitrile (DMF), dimethyl sulfoxide (DMSO), N-methylpyrrolidone (NMP), methylethylketone (MEK), ethyl acetate (EA), methyl isobutyl ketone (MIBK), or a combination thereof. Polar protic solvents are solvents, which contain dissociable H⁺, for example acetic acid, formic acid, n-butanol, isopropanol, or a combination thereof.

Figure 4:
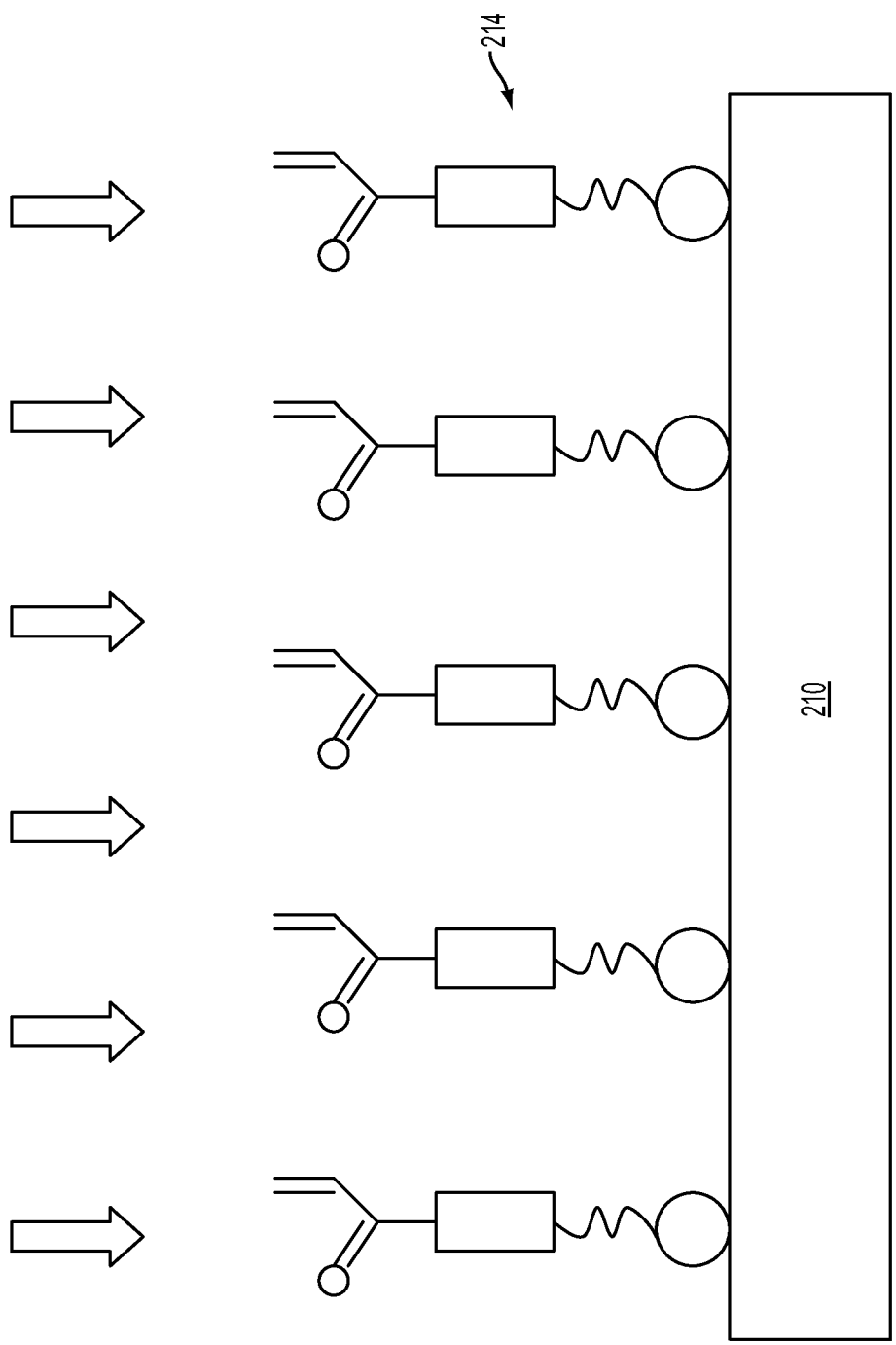

In FIG. 4 a photoalignment treatment is performed on the photoalignment layer wherein the molecules of the photoalignment layer are reorganized and aligned into photoalignment layer 214 (operation 106). In at least one embodiment, the treatment comprises exposing the photoalignment layer 212 to an aligning light composed of ultraviolet radiation, and the ultraviolet radiation has wavelength ranging from 100 nm to 400 nm. The aligning light may be polarized, for example linearly, elliptically or, circularly. In some alternative embodiments, the treatment comprises heating the photoalignment layer 212 to reorganize and align the molecules forming photoalignment layer 214. The treatment is for applying energy for the molecular structure arrangement. This molecule alignment creates a pattern over which the subsequent photoresist material may be formed, providing a more uniform molecular arrangement than conventional photoresist.

Figure 5:
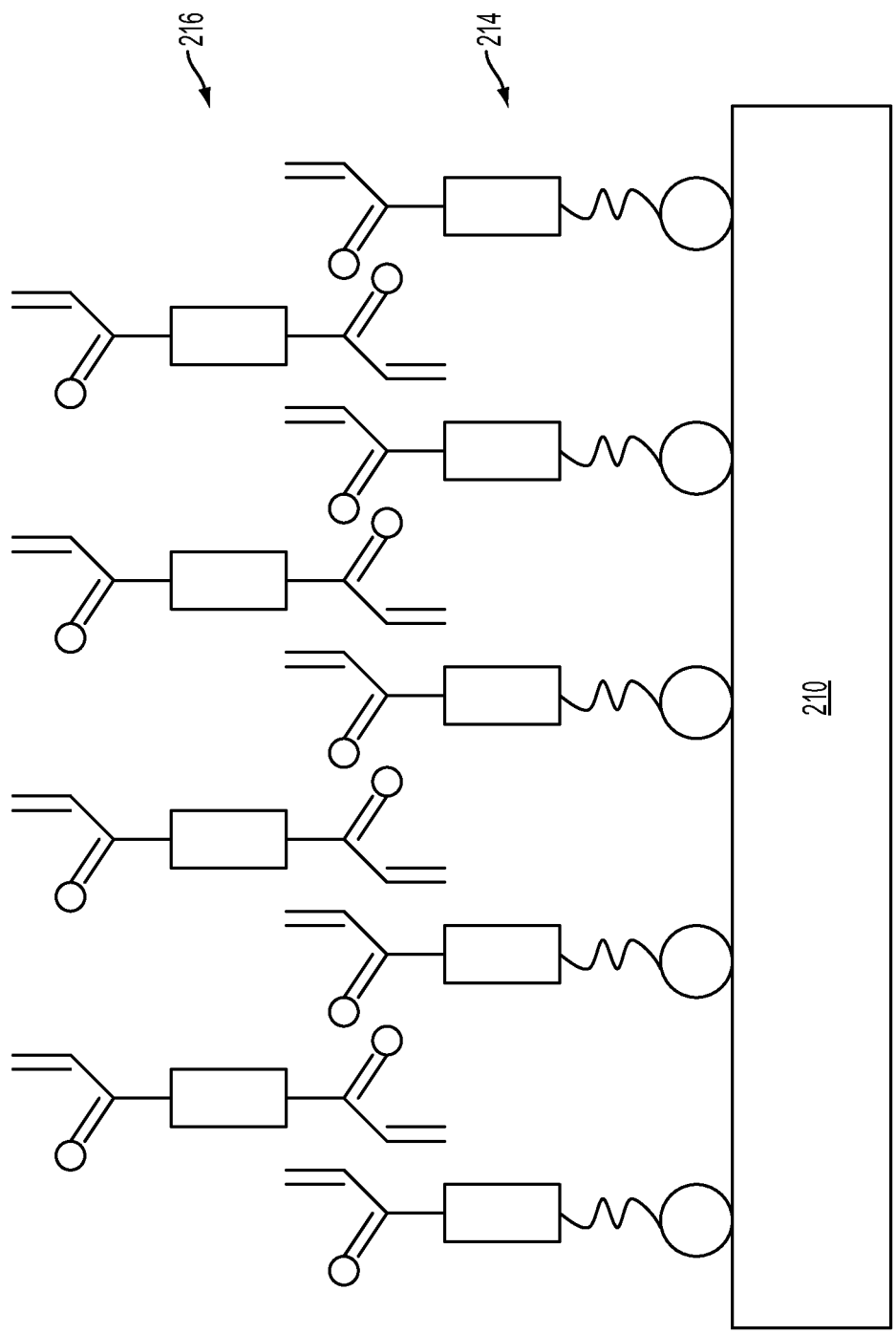

In FIG. 5, a photoresist layer 216 is formed over the photoalignment layer 214 (operation 108). In the depicted embodiment, the photoresist layer 216 is formed by spin coating process or another suitable process. In some embodiments, the photoresist layer 216 may be composed of organic or inorganic sources. The organic material may comprise at least a polymer, photoacid generator (PAG), quencher, chromophore, electron acceptor, photodegradable base, and/or the solvent. The organic material may also comprise surfactant, additives, and/or a cross linker. The molecular weight of the polymer may be about 500 to about 30,000 Dalton [units]. In some embodiments, the organic material may comprise photosensitive or non-photosensitive polymers. A photosensitive polymer may be sensitive to 1-line, KrF, ArF, EUV, E beam light sources, or a combination thereof. The photosensitive polymer may be a positive tone or a negative tone polymer. A positive tone polymer may comprise polyacrylate, poly (methyl methyacrylate), ploy (vinyl alcohol), or molecular gases (MG). The photosensitive polymer may be an acid cleavable polymer. The PAG will release acid after optical exposure. The acid will cleave the acid cleavable polymer in the post exposure baking (PEB) step. After the acid cleaves the polymer, the polymer becomes more hydrophilic. After the polymer becomes more hydrophilic, the polymer may be dissolved by basic solution, for example 2.38% TMAH$_{(aq)}$.

In some embodiments, the photosensitive polymer may be a negative tone polymer. The negative tone polymer comprises at least one acid catalyzed or thermal cross linkable polymer. The thermal curable polymer may comprise polyurethane, polycarbonate, polyepoxide, or polyacrylate. The acid catalyzed curable polymer may comprise polyacrylate, poly (methyl methyacrylate), poly (vinyl alcohol), or molecular gases (MG). The PAG will release acid after optical exposure. The acid will catalyze the cross linking reaction of the cross linkable polymer and the heat will cause the thermal curable polymer to do a thermal coupling reaction. After the polymer cross link was completed, the polymer becomes more hydrophobic. After the polymer becomes more hydrophobic, the polymer may not be dissolved by basic solution, for example 2.38% TAMH$_{(aq)}$.

The photosensitive polymer may be further softened by a heat treatment, producing a better interaction between the photoresist and photoalignment layer. In at least one embodiment, a temperature range of about 50 to 150 degree Celsius is used in order to exclude the remains solvent in the photoresist.

Figure 6:
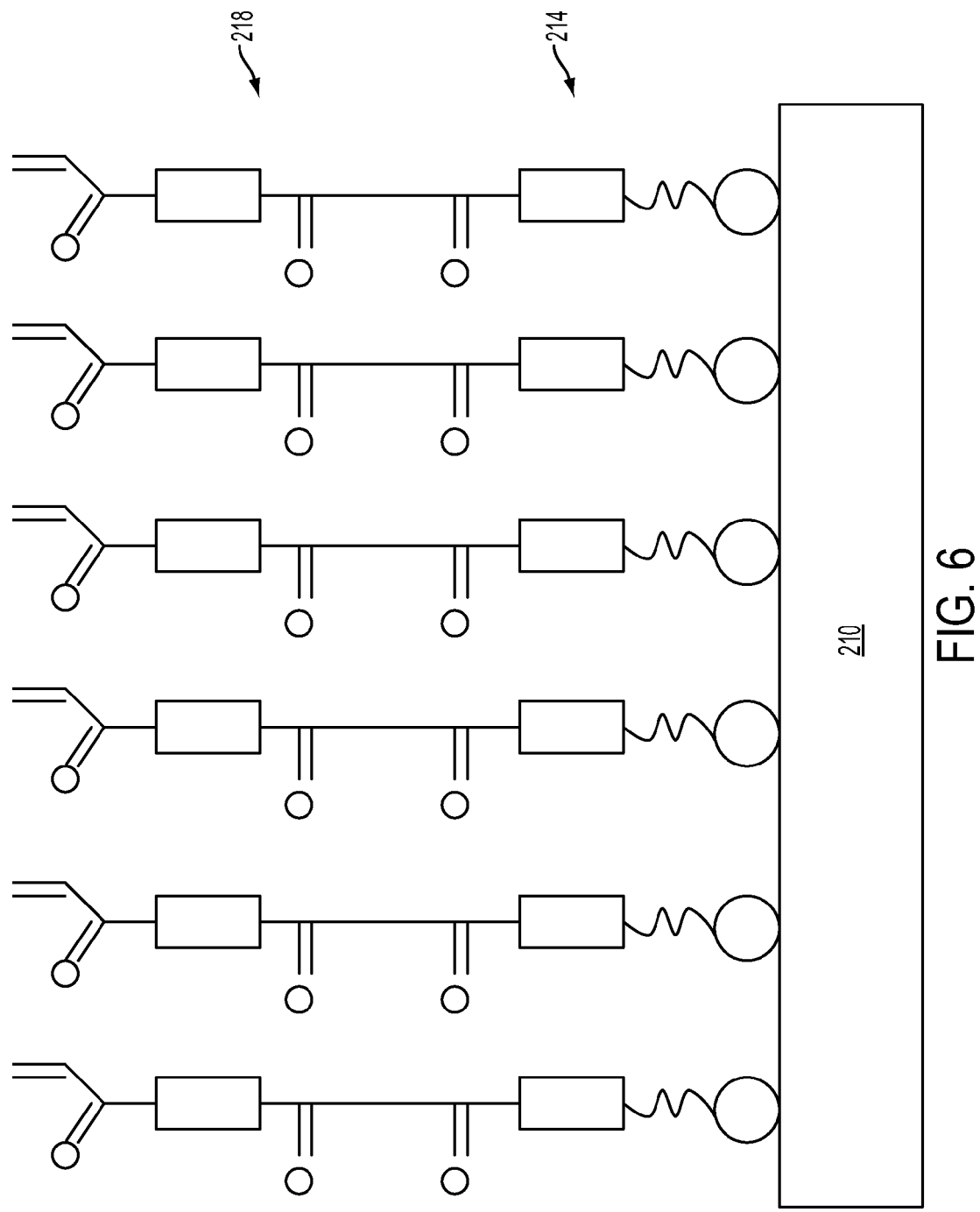

In FIG. 6, a polymerization treatment is performed on the photoresist layer and the photoalignment layer wherein the molecules of the photoresist layer 218 after the polymerization treatment are aligned with the photoalignment molecules (operation 110). The treatment purpose is to apply energy for chemical bond rearrangement. In at least one embodiment, the treatment comprises exposing the photoalignment layer to UV radiation. In some alternative embodiments, the treatment comprises heating the photoalignment layer to reorganize and align the molecules.

The benefit of this treatment is that the organized molecules in the photoresist and photoalignment layers reduce the line width roughness (LWR) and line edge roughness (LER) during the subsequent photolithography process. This increases the resolution of the photolithography and allows for a finer pattern and a reduction in image blurring in the photoresist material during the subsequent etching process. The higher resolution of the photolithography allows for further miniaturization of microelectronic devices.

Figure 7:
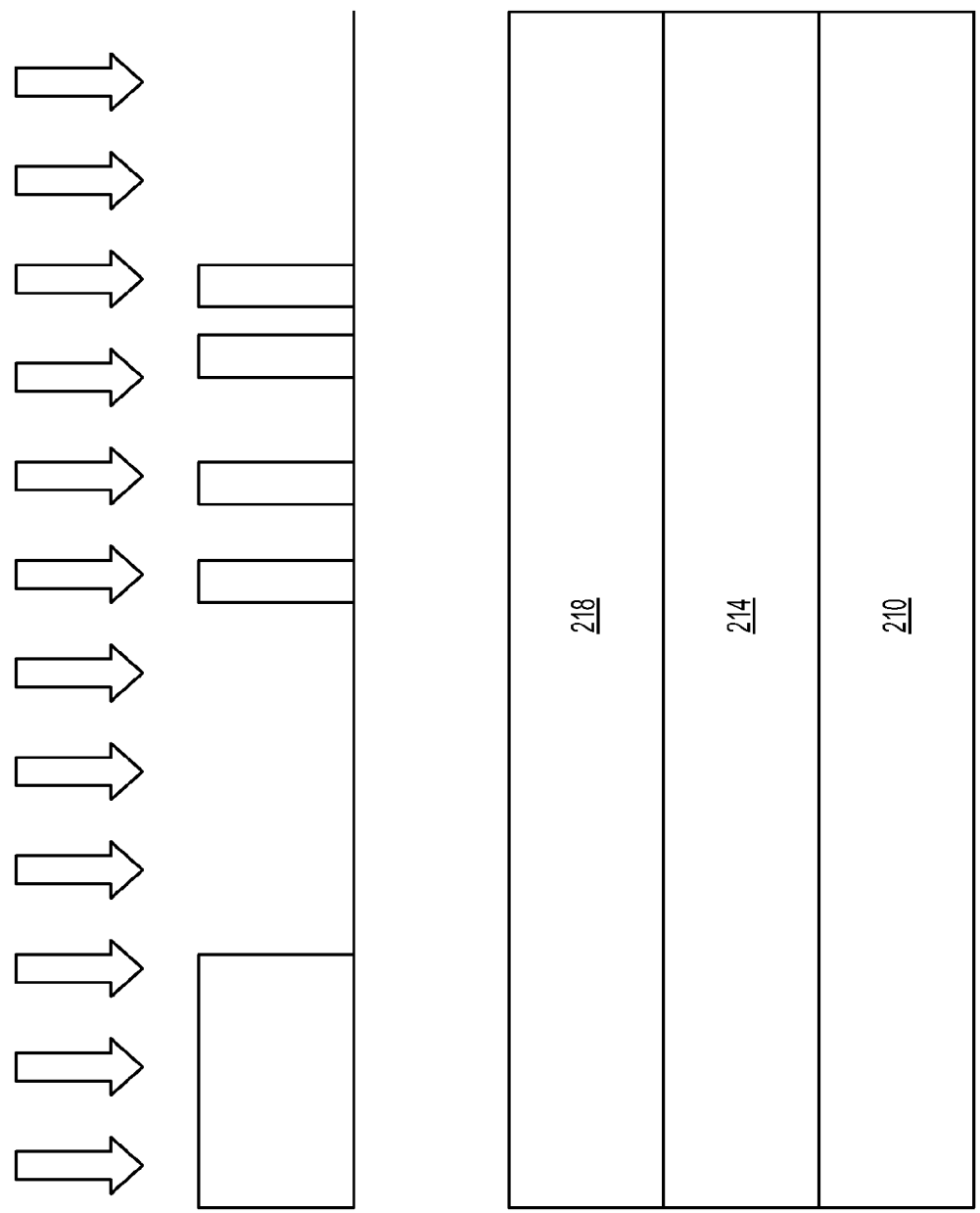
Figure 8:
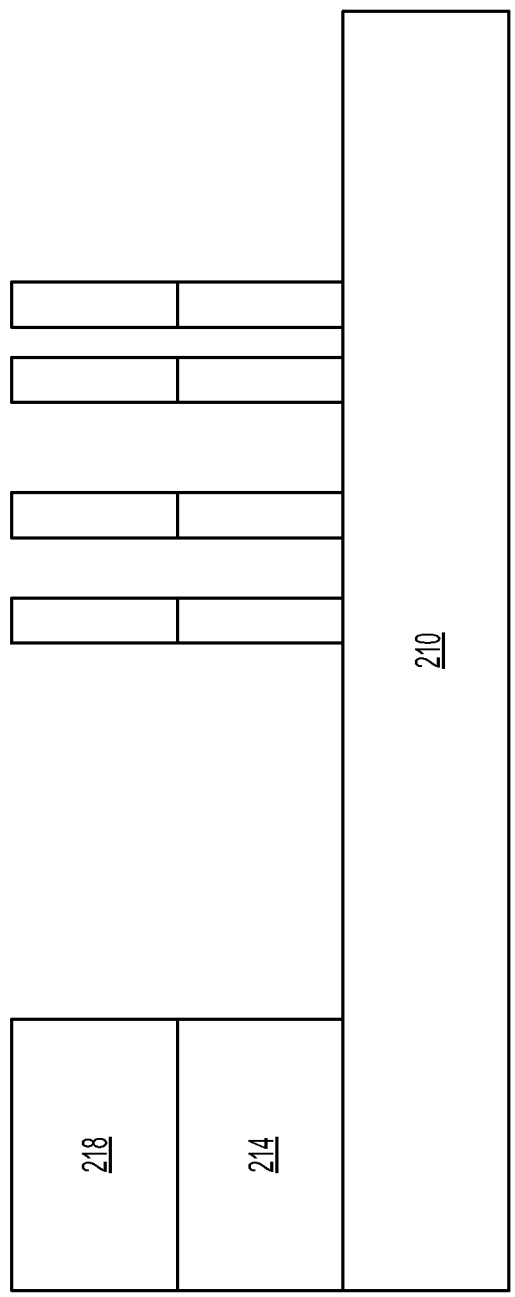

In FIG. 7, the photoresist and photoalignment layers 218 and 214 are then exposed to a predetermined patterned photomask (operation 112). In FIG. 8, the photoresist and photoalignment layers 218 and 214 are developed to expose a portion of the substrate 210 for a subsequent process (operation 114). This is done by a suitable photolithography process.

Figure 9:
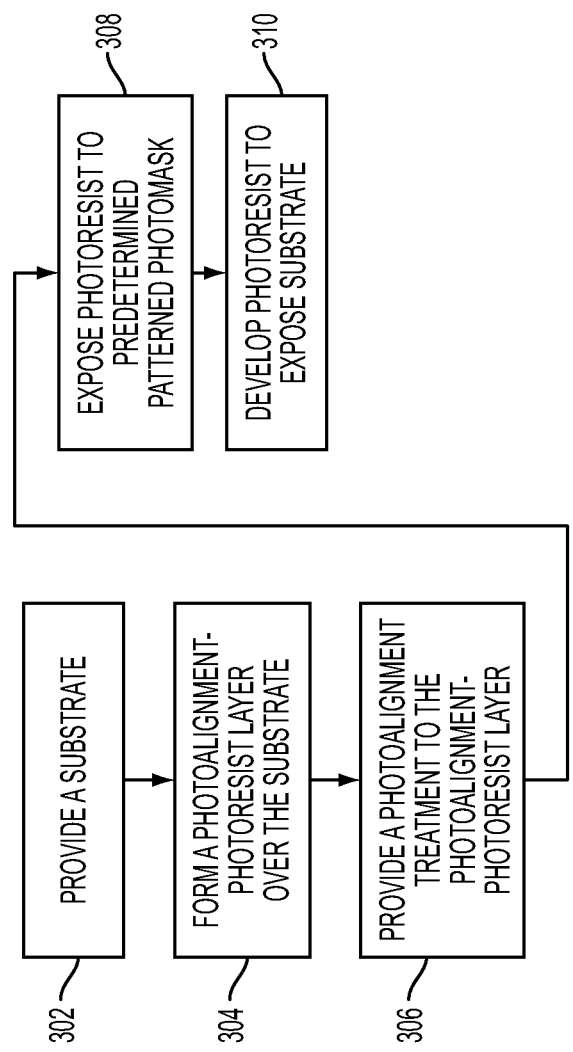
FIG. 9 is a flow chart of a method of fabricating an integrated circuit device according to another embodiment of the present disclosure.

FIG. 9 describes another embodiment, where in the photoalignment and photoresist layers are combined to form a photoalignment-photoresist layer. In the depicted embodiment, the photoalignment layer and subsequent photoresist layers form a bound-bind structure coating. In at least one embodiment, the photoalignment-photoresist layer has a thickness ranging from 10 nm to 100 nm.

Figure 10:
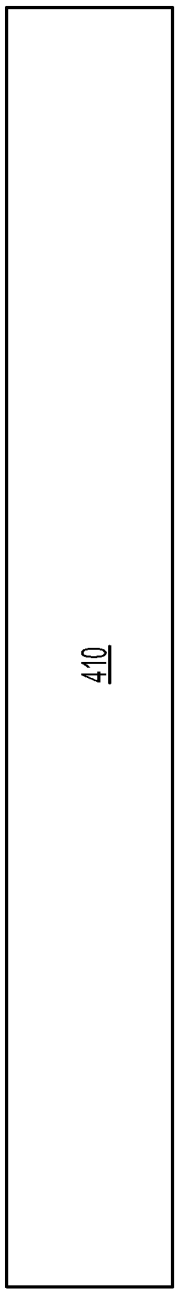
FIGS. 10-14 are various diagrammatic cross-sectional views of an embodiment of an integrated circuit device during various fabrication states according to the method of FIG. 2.

In FIG. 10, a substrate 410 is provided (operation 302). In the depicted embodiment, the substrate is a dielectric with a dielectric constant from about 1 to about 40. In the depicted embodiment, the substrate comprises at least silicon, metal oxide, or metal nitride. For example, a formula may be $MX_n$, where M is a metal or Si, and X is Nitrogen or Oxygen with n ranging from about 0.4 to about 2.5. For example, in some embodiments, $SiO_2$, silicon nitride, aluminum oxide, hafnium oxide, or lanthanum oxide may be used.

Figure 11:
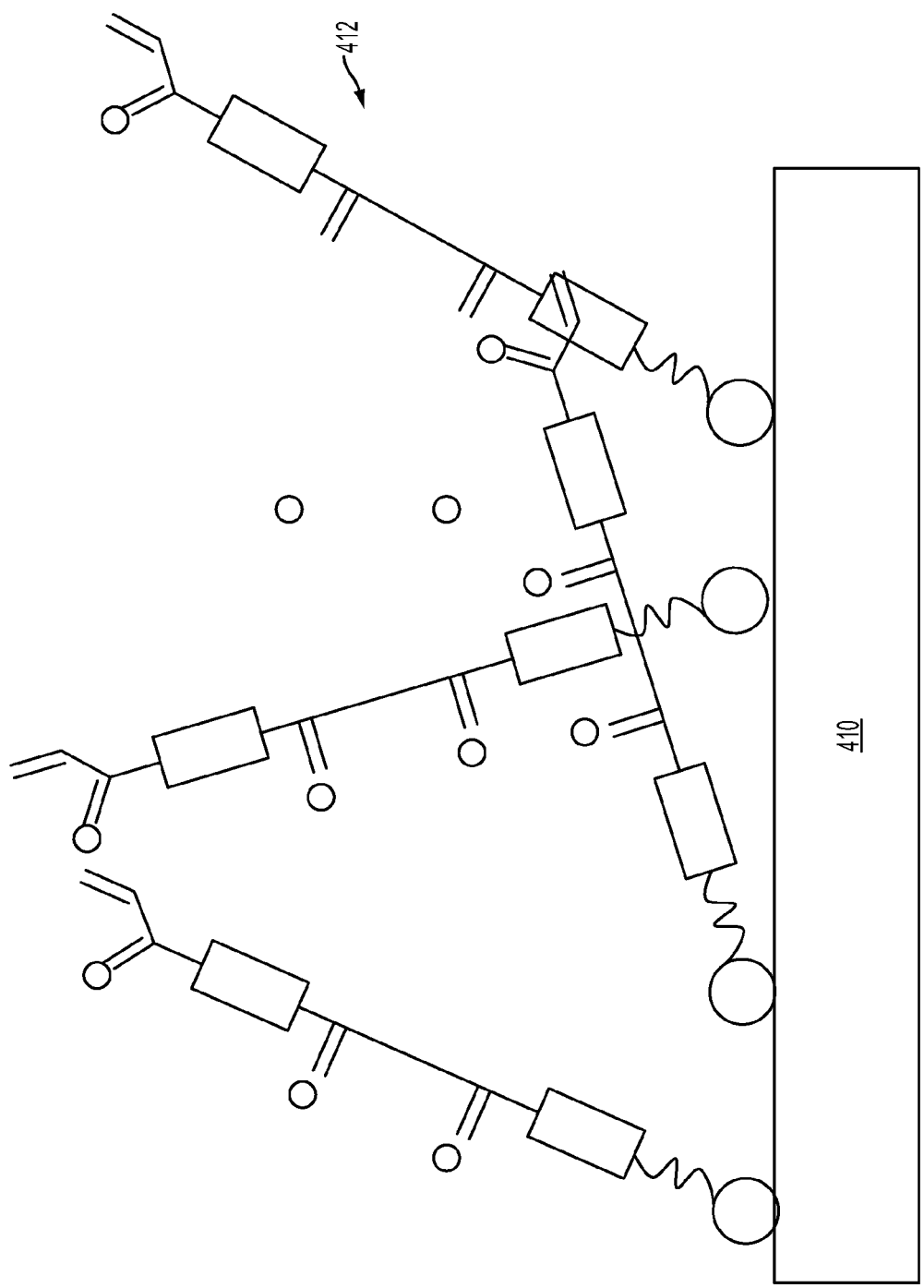

In FIG. 11, the photoalignment-photoresist layer 412 is then formed over the substrate 410 (operation 304). In the depicted embodiment, the photoalignment-photoresist layer 412 is formed by spin coating process or another suitable process. Photoalignment and polymerization treatments may be performed on the photoalignment-photoresist layer to align the molecules for the subsequent photolithography processes.

In some embodiments, the photoalignment component may be composed of a photoalignment polymer. In some embodiments, the photoalignment polymer may be an organic material. For example, the organic material may comprise at least a photoreactive compound, a non-photoreactive compound, reactive or non-reactive additives, and/or a solvent. In the depicted embodiment, the photoalignment material is a liquid crystal organic polymer comprising photoreactive groups.

Figure 12:
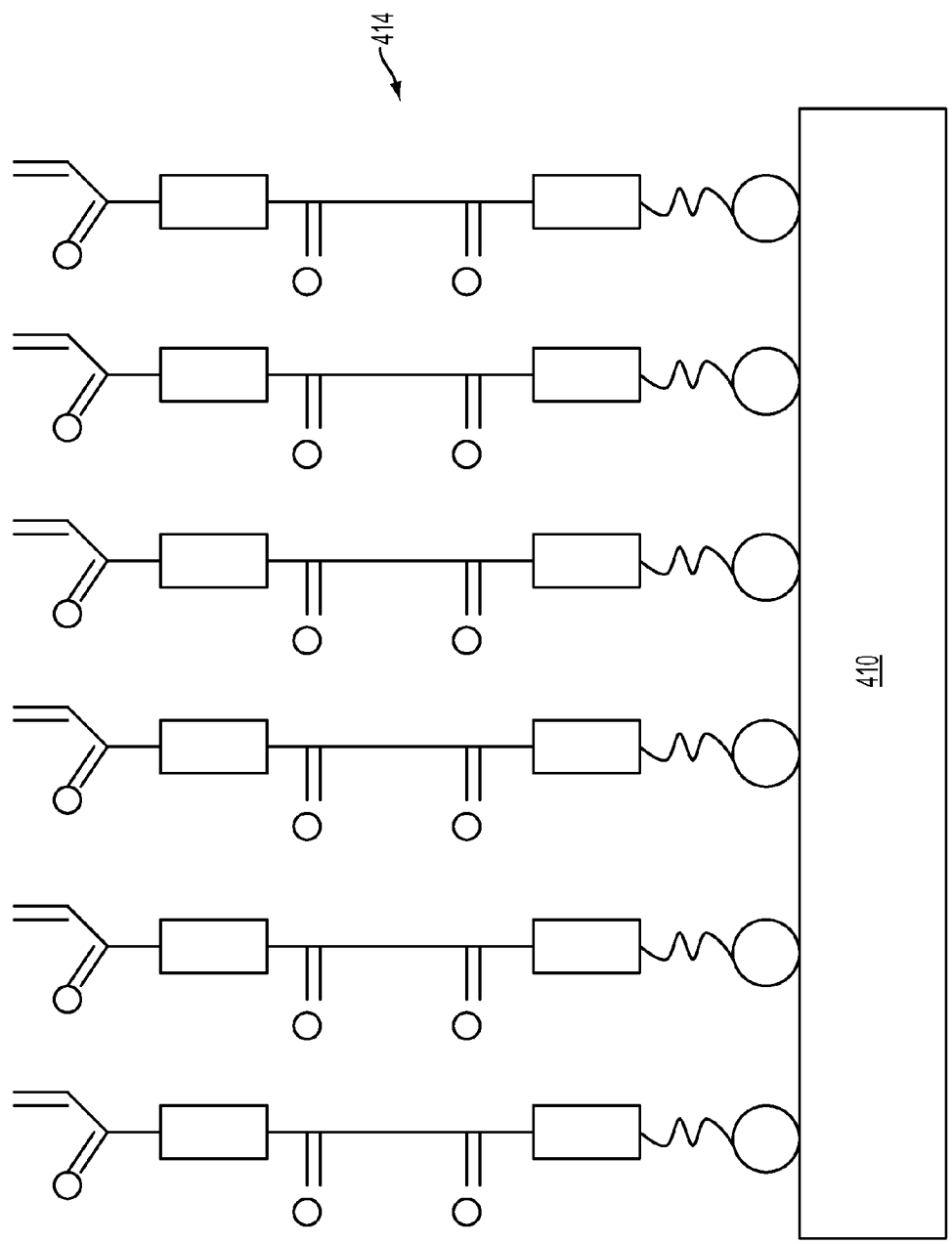

In FIG. 12, a photoalignment treatment is performed on the photoalignment-photoresist layer 412 wherein the molecules of the photoalignment-photoresist layer is reorganized and aligned into photoalignment-photoresist layer 414 (operation 306). In at least one embodiment, the treatment comprises exposing the photoalignment-photoresist layer 412 to an aligning light, for example ultraviolet radiation. The aligning light may be polarized, for example linearly, elliptically or, circularly. In some alternative embodiments, the treatment comprising heating the photoalignment-photoresist layer 412.

The benefit of this treatment is that the organized molecules in the photoalignment-photoresist layer 414 reduce the line width roughness (LWR) and line edge roughness (LER) during the subsequent photolithography process. This increases the resolution of the photolithography and allows for a finer pattern in the photoresist material during the subsequent etching process. The higher resolution of the photolithography allows for further miniaturization of microelectronic devices.

In some embodiments, a polymerization treatment may be performed on the photoalignment-photoresist layer 414. In at least one embodiment, the treatment comprises exposing the photoalignment layer to UV radiation. In an alternative embodiment, the treatment consists of heating the photoalignment layer to reorganize and align the molecules.

Figure 13:
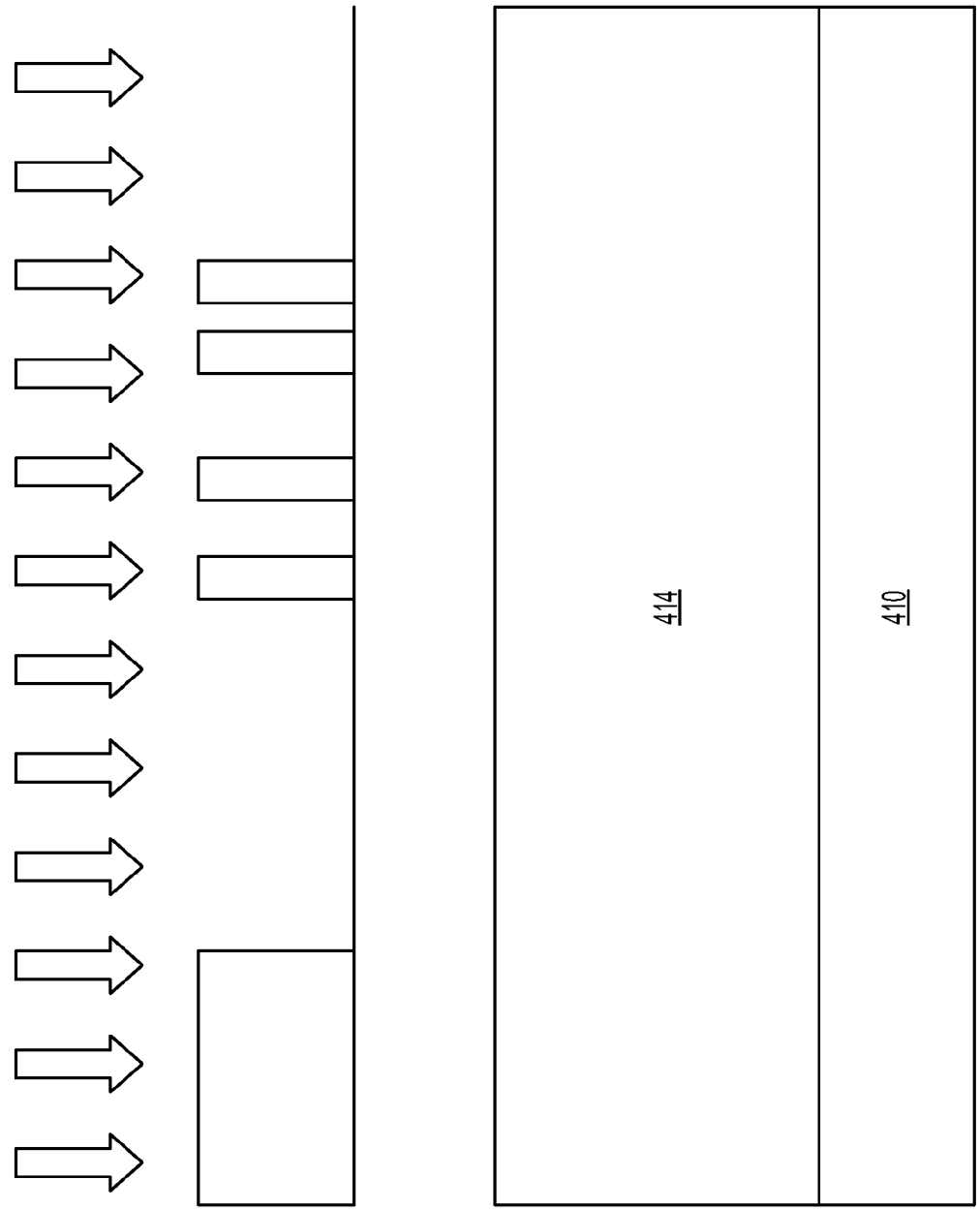
Figure 14:
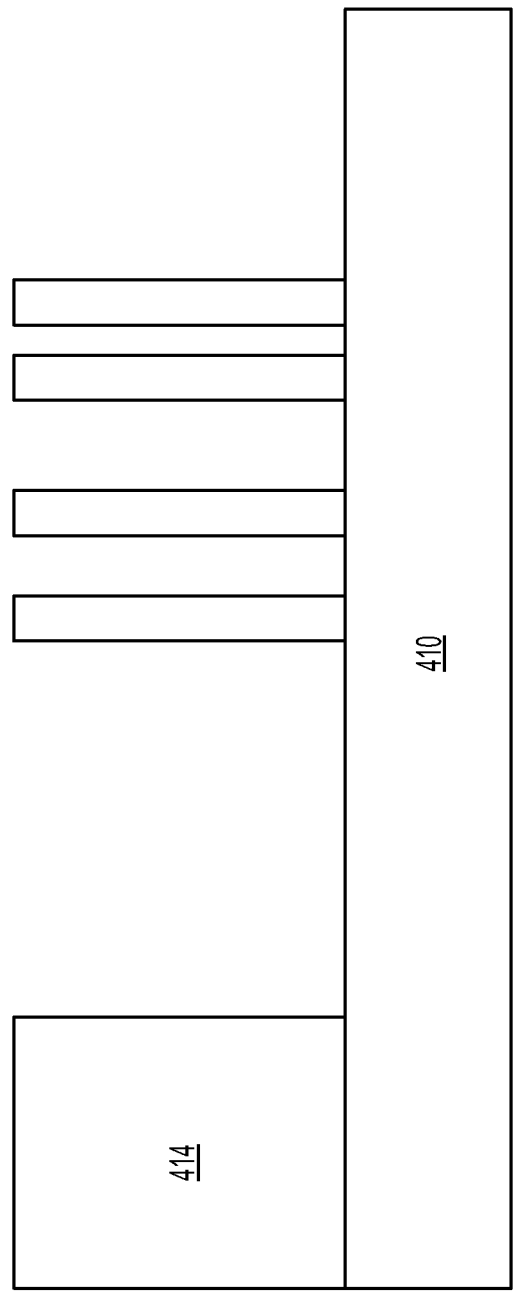

In FIG. 13, the photoalignment-photoresist layer 414 is then exposed to a predetermined patterned photomask (operation 308). In FIG. 14, the photoalignment-photoresist layer is developed to expose the substrate 410 for a subsequent process (operation 310). This is performed by a suitable photolithography process.

Various modifications, changes, and variations apparent to those of skill in the art may be made in the arrangement, operation, and details of the methods and devices disclosed. Although the foregoing embodiments have been described in some detail for purposes of clarity of understanding, it will be apparent that certain changes and modifications may be practiced within the scope of the appended claims. Accordingly, the present embodiments are to be considered as illustrative and not restrictive, and the embodiments are not to be limited to the details given herein.

What is claimed is:

1. A method comprising:
   forming a photoalignment layer over a substrate;
   performing a treatment to the photoalignment layer;
   forming a photoresist layer over the photoalignment layer;
   exposing the photoresist layer to a predetermined pattern; and
   developing the photoresist and the photoalignment layers to form a pattern and expose a portion of the substrate.

2. The method of claim 1, wherein the photoalignment layer has a thickness range between 1 nm to 50 nm.

3. The method of claim 1, wherein the photoalignment layer is composed of a polymer compound.

4. The method of claim 1, wherein the treatment to the photoalignment layer alters the orientation, organization, or alignment of molecules of the photoalignment layer.

5. The method of claim 4, wherein the treatment to the photoalignment layer comprises exposing the photoalignment layer to ultraviolet radiation.

6. The method of claim 4, wherein the treatment to the photoalignment layer comprises exposing the photoalignment layer to heat.

7. The method of claim 1, wherein a polymerization treatment is performed on the photoalignment and photoresist layers.

8. The method of claim 7, wherein the polymerization treatment to the photoalignment and photoresist layers comprises exposing the photoalignment and photoresist layers to ultraviolet radiation.

9. The method of claim 8, wherein the ultraviolet radiation has wavelength range from 100 nm to 400 nm.

10. The method of claim 7, wherein the polymerization treatment to the photoalignment and photoresist layers comprises exposing the photoalignment and photoresist layers to heat.

11. A method comprising:
    forming a photoalignment polymer layer over a substrate;
    performing a treatment to the photoalignment layer that alters the orientation of molecules of the photoalignment layer;
    forming a photoresist layer over the photoalignment layer;
    exposing the photoresist layer to a predetermined pattern; and
    developing the photoresist and the photoalignment layers to form a pattern and expose a portion of the substrate.

12. The method of claim 11, wherein the photoalignment layer is composed of a polymer compound.

13. The method of claim 11, wherein the treatment to the photoalignment layer comprises exposing the photoalignment layer to ultraviolet radiation or heat.

14. The method of claim 11, further comprising performing a polymerization treatment on the photoalignment layer and the photoresist layer.

15. The method of claim 14, wherein the polymerization treatment comprises exposing the photoalignment layer and the photoresist layer to ultraviolet radiation or heat.

16. The method of claim 15, wherein the ultraviolet radiation has wavelength range from 100 nm to 400 nm.

17. A method comprising:
    forming a layer of photoalignment material over a substrate;
    performing a treatment to the layer of photoalignment material to cause molecules of the layer of photoalignment material to be aligned along a predetermined direction;
    forming a photoresist layer over the layer of photoalignment material; and
    patterning the photoresist layer and the layer of photoalignment material, thereby exposing a portion of the substrate.

18. The method of claim 17, wherein the treatment to the layer of photoalignment material comprises exposing the layer of photoalignment material to ultraviolet radiation or heat.

19. The method of claim 17, further comprising performing a polymerization treatment on the layer of photoalignment material and the photoresist layer.

20. The method of claim 19, wherein the polymerization treatment comprises exposing the layer of photoalignment material and the photoresist layer to ultraviolet radiation or heat.

* * * * *